United States Patent
Le

(10) Patent No.: US 6,188,634 B1
(45) Date of Patent: Feb. 13, 2001

(54) SEMICONDUCTOR MEMORY HAVING MEMORY BANK DECODERS DISPOSED SYMMETRICALLY ON A CHIP

(75) Inventor: Thoai-Thai Le, Munich (DE)

(73) Assignee: Infineon Technologies AG, Munich (DE)

( * ) Notice: Under 35 U.S.C. 154(b), the term of this patent shall be extended for 0 days.

(21) Appl. No.: 09/505,379

(22) Filed: Feb. 16, 2000

(30) Foreign Application Priority Data

Feb. 16, 1999 (DE) .............................................. 199 06 382

(51) Int. Cl.[7] .................................................... G11C 8/12
(52) U.S. Cl. ................... 365/230.06; 365/230.03; 365/189.08; 365/190; 365/51; 365/63
(58) Field of Search ...................... 365/230.06, 230.03, 365/238.5, 190, 189.08, 195, 51, 63

(56) References Cited

U.S. PATENT DOCUMENTS 5,867,445 * 2/1999 Kirsch et al. ................... 365/230.06

FOREIGN PATENT DOCUMENTS

0422299A1 4/1991 (EP) ................................ G11C/7/00
0493615A1 7/1992 (EP) ............................. H01L/27/04

* cited by examiner

Primary Examiner—Andrew Q. Tran
(74) Attorney, Agent, or Firm—Herbert L. Lerner; Laurence A. Greenberg; Werner H. Stemer

(57) ABSTRACT

In semiconductor memories, memory banks are activated via memory bank decoders. The memory bank decoders assigned to different groups of memory banks have a layout that is symmetrical with respect to an axis of mirror symmetry. A changeover is made between the memory bank decoders by a predecoder. For this purpose, the predecoder generates enable and address signals for the memory banks. This enables the memory bank decoders to be disposed on the semiconductor chip in direct proximity to the respectively assigned memory banks.

8 Claims, 4 Drawing Sheets

SEMICONDUCTOR MEMORY HAVING MEMORY BANK DECODERS DISPOSED SYMMETRICALLY ON A CHIP

BACKGROUND OF THE INVENTION

Field of the Invention

The invention relates to a semiconductor memory having memory banks that can be selected by assigned memory bank decoders.

It is known that memory cells in a semiconductor memory are disposed in a matrix-like manner, that is to say in rows and columns. Respective address decoders are provided for rows and columns and make it possible to select one of the rows or columns, respectively. The memory cells are usually activated in a row-by-row manner via word lines, by access transistors being turned on, via which transistors access is made in each case to a capacitor storing the information of the memory cell. In a column-by-column manner, the conduction path of the transistors is connected to bit lines via which the information of a memory cell can be read out after amplification by a sense amplifier. Access is effected in a corresponding manner when information to be stored is written to the memory cell.

In recent semiconductor memories having dynamic memory cells (DRAMs), the memory cell array has a bank architecture. A memory bank contains all those functional units that are necessary to execute a memory access independently. A memory bank is therefore assigned respective row and column address decoders, and also sense amplifiers and other functional units required for the operation of the semiconductor memory, e.g. timing circuits, redundancy circuits, etc. If appropriate, functional units of different memory banks can be utilized together, for example sense amplifiers or bit line decoders or column decoders.

A memory bank and the functional units assigned to it are activated by memory bank decoders. If a specific memory cell in a memory bank is to be accessed, the functional units assigned to the memory bank are changed over from a standby state to an activated state. This addressing is effected by an output signal, assigned to the memory bank, of the memory bank decoder. Each memory bank has a unique memory bank address assigned to it. If this address is applied to the memory bank decoder, the latter's output signal assigned to the memory bank is activated.

As the number of memory banks increases, the memory bank decoders are becoming more and more complex. For example, a DRAM with a storage capacity of 64 MB contains 16 memory banks, and a DRAM with 128 MB contains 32 memory banks. A single decoder respectively having 16 or 32 output signals for activating a respective memory bank is so complex and requires, on the chip carrying the integrated semiconductor memory, such a large area in the circuitry realization that the regularity of the chip geometry is disturbed.

SUMMARY OF THE INVENTION

It is accordingly an object of the invention to provide a semiconductor memory having memory banks which overcomes the above-mentioned disadvantages of the prior art devices of this general type, in which the configuration complexity for the memory bank decoders is reduced.

With the foregoing and other objects in view there is provided, in accordance with the invention, a semiconductor memory, containing:

a number of memory banks, each including:
  a memory cell array having a multiplicity of memory cells disposed in a matrix-like manner having rows and columns and defining a matrix of memory cells; and
  an address decoder for selecting one of a row and a column of the matrix of memory cells;
means for feeding in an address containing a number of address bits for selecting one of the row and the column of one of the memory cells by addressing the address decoder;
memory bank decoders, including:
  a first memory bank decoder connected to a first group of the memory banks, the first memory bank decoder having an input side, an output side and generating a first respective bank selection signal available at the output side for each memory bank of the first group of the memory banks, resulting in one of the memory banks of the first group of memory banks being selected by an activation of the first respective bank selection signal; and
  a second memory bank decoder connected to a second group of the memory banks and having an axially mirror-symmetrical layout with respect to the first memory bank decoder, the second memory bank decoder having an input side, an output side and generating a second respective bank selection signal available at the output side for each memory bank of the second group of the memory banks, resulting in that one of the memory banks of the second group of the memory banks being selected by an activation of the second respective bank selection signal; and
a predecoder having a logic circuit, an input side and an output side, the predecoder generating on the output side first address signals and second address signals complementary to the first address signals, the first address signals and the second address signals being fed to the first memory bank decoder and the second memory bank decoder, respectfully, and the input side of the predecoder receiving a portion of the address bits.

In the case of the semiconductor memory according to the invention, the layout of the memory bank decoders assigned to different groups of the memory banks is configured to be axially mirror-symmetrical. A changeover is made between the memory bank decoders by a predecoder. Since one of the memory bank decoders addresses only a portion of all the memory banks of the semiconductor memory, the circuits for the realization thereof are manageable. As a result of the axial mirroring of the layout and the provision of the predecoder, the number of decodable memory banks is doubled based on one memory bank decoder. In an advantageous manner, the mutually mirror-symmetrical memory bank decoders can be disposed at an edge end of the memory banks to which the memory bank decoders are respectively assigned. In an expedient manner, the groups of memory banks that are addressed by a respective memory bank decoder are positioned in the direction of the corners of a rectangular semiconductor chip containing the semiconductor memory. The memory bank decoder lies opposite the inwardly directed ends of the memory banks. Only the predecoder and the output signals generated by the predecoder lie between the groups of memory banks.

Other features which are considered as characteristic for the invention are set forth in the appended claims.

Although the invention is illustrated and described herein as embodied in a semiconductor memory having memory banks, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
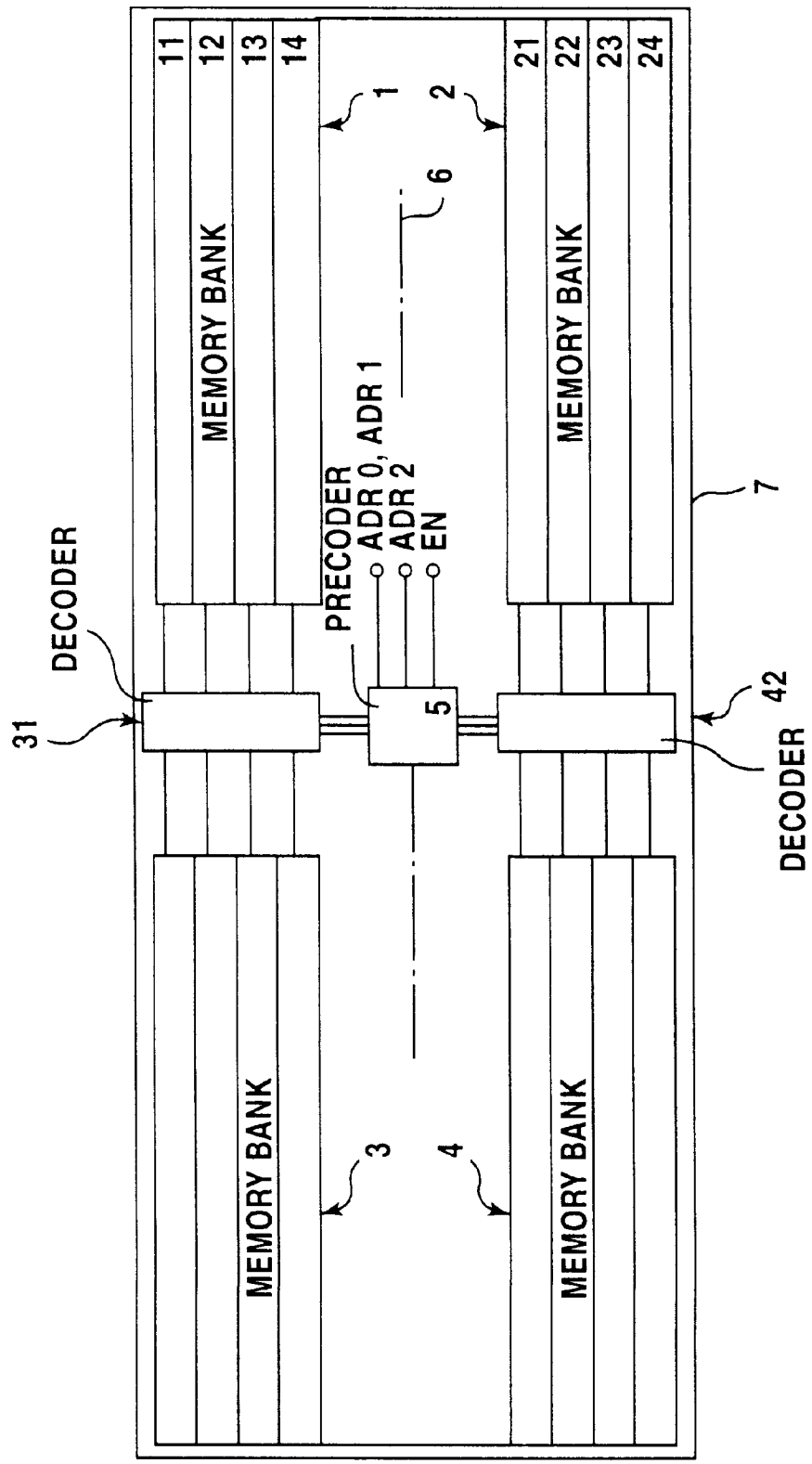
FIG. 1 is a block diagram of a semiconductor memory having 16 memory banks according to the invention.

In all the figures of the drawing, sub-features and integral parts that correspond to one another bear the same reference symbol in each case. Referring now to the figures of the drawing in detail and first, particularly, to FIG. 1 thereof, there is shown a semiconductor memory that contains four groups 1, 2, 3, 4 of memory banks. Each of the groups of the memory banks 1–4 has in each case four memory banks. The memory banks 11, . . . , 14 of group 1 are addressed by a memory bank decoder 31, the memory banks 21, . . . , 24 of group 2 are addressed by a memory bank decoder 42. The memory banks of groups 1 and 3, and 2 and 4, are addressed identically by the respective memory bank decoders 31 and 42, respectively.

Therefore, eight memory bank pairs can be addressed. In a departure from the illustration shown, it is also possible for the memory banks of groups 3 and 4 to be assigned dedicated memory bank decoders. For their part, the memory bank decoders 31, 42 are in turn addressed by a predecoder 5. On an input side, an enable signal EN and also three address signals ADR0, ADR1, ADR2 are fed to the predecoder 5. The three address signals serve for unambiguously selecting one of the eight memory banks 11, . . . , 14, 21, . . . , 24. The enable signal EN is generated on-chip and serves for correctly timed activation of the memory banks. The enable signal EN indicates that the applied address is valid. The address signals are applied externally to the chip. A memory cell is identified by an address. Depending on the organization of the memory, a single memory cell or a plurality of memory cells, a so-called memory word, is or are simultaneously selected by an address. The address consists of a large number of address bits, the address bits ADR0, ADR1, ADR2 being the most significant address bits, for example. The layout of the memory banks 1 and 3 undergoes a transition into the layout of the memory banks 2 and 4 as a result of mirroring at an axis 6 of symmetry. The memory banks are therefore symmetrical with respect to the axis 6 of symmetry. In this case, the layout is understood to be the geometrical structures in the silicon of the chip carrying the integrated semiconductor memory, which structures can be assigned to the decoders 31, 42 and essentially contain the circuits for realizing the decoders 31, 42.

Figure 2:
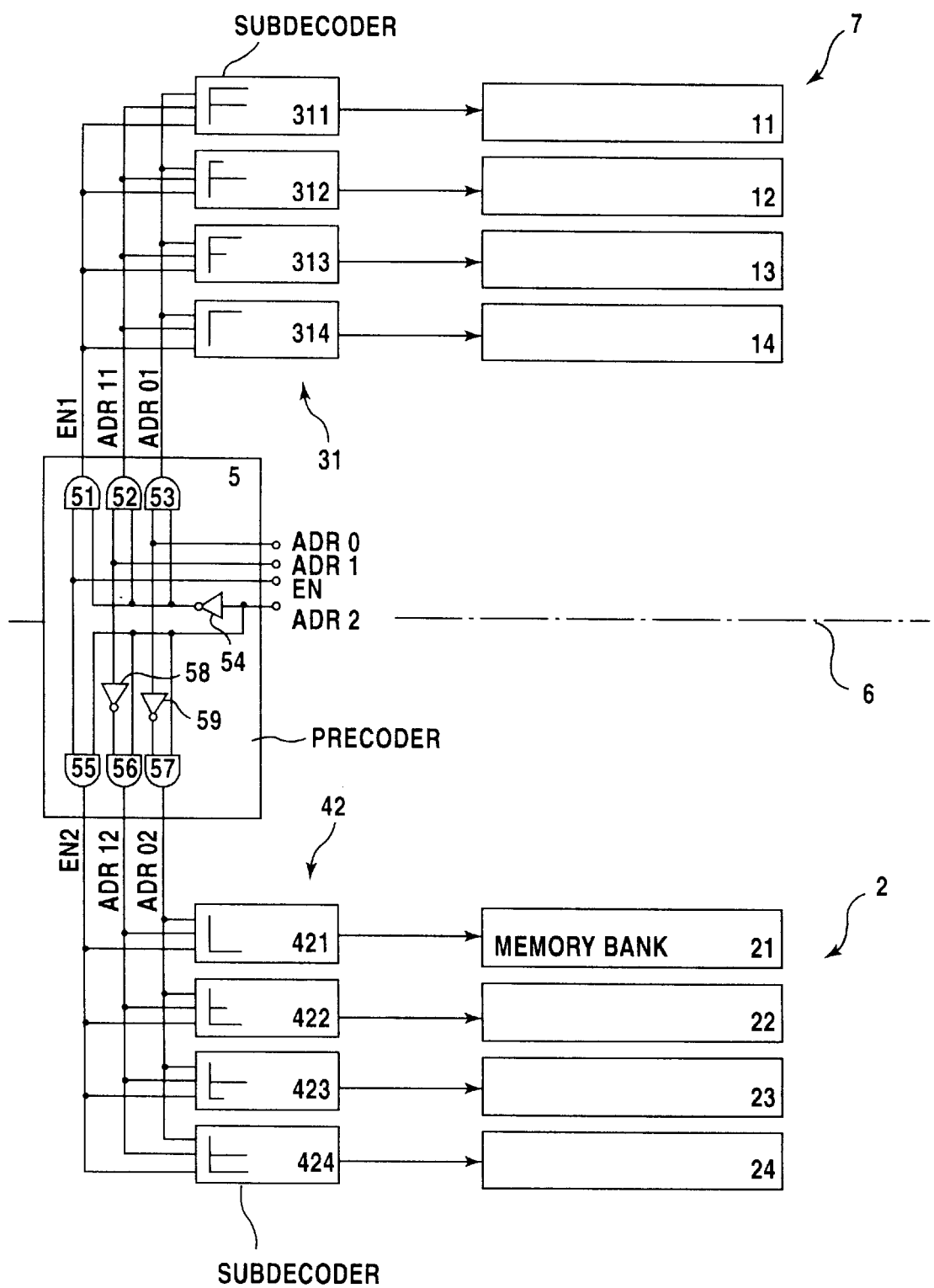
FIG. 2 is a block diagram of a detail from the semiconductor memory, in which a predecoder and a memory bank decoder are illustrated in more detail.
Figure 4:
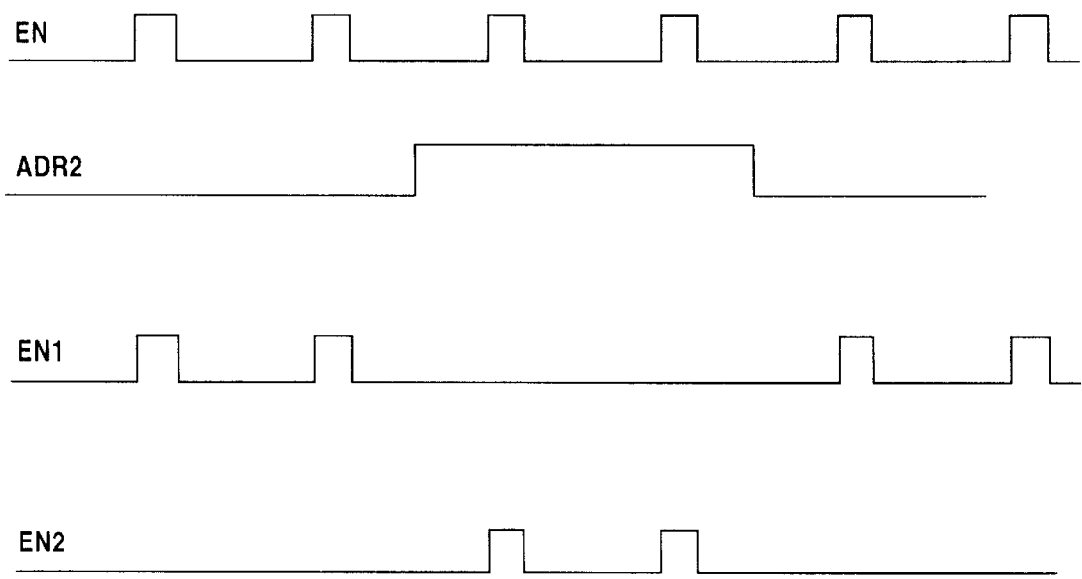
FIG. 4 is a signal diagram of signals that occur at the predecoder.

As is illustrated in more detail in FIG. 2, the memory bank decoder 31 contains respective subdecoders 311, . . . , 314; the memory bank decoder 42 contains respective subdecoders 421, . . . , 424. The subdecoders 311–314 of the decoder 31 are each fed the same signals that have been generated by the predecoder 5. Each of the subdecoders 311–314 of the memory bank decoder 31 receives an enable signal EN1 and also address signals ADR11, ADR01. In each case with a different combination of the states of the address signals ADR11, ADR01, the subdecoders 311, . . . , 314 activate an output signal which is fed to a respectively assigned memory bank 11, . . . , 14. In a corresponding manner, an enable signal EN2 and also address signals ADR12, ADR02 are respectively fed to the subdecoders 4121–424 of the memory bank decoder 42. The signals ADR12, ADR02 fed to the memory bank decoder 42 are inverted with respect to the signals ADR11, ADR01 fed to the memory bank decoder 31. As illustrated in FIG. 4, the enable signals EN1, EN2 in the exemplary embodiment are pulses, pulses occurring between the signals EN1, EN2 only as an alternative. In general, the pulses occur asynchronously depending on the activation of the addresses. Moreover, the layout structures of the circuits of the respective subdecoders 421–424 of the memory bank decoder 42 emerge from the respective layout structures of the subdecoders 311–314 of the memory bank decoder 31 as a result of axial mirroring at the axis 6 of symmetry. The mirror axis 6 lies between the memory bank decoders 31, 42. With a symmetrical configuration of the circuit sections on the semiconductor chip, the mirror axis 6 lies in the center of the chip. For the configuration of the entire memory bank decoding of the semiconductor memory, only the layout of the subdecoder elements 311, . . . , 314 needs to be configured; the layout of the elements 421, . . . , 424 is produced by simply mirroring. It is furthermore advantageous that the memory bank decoding takes place "decentralized". The memory bank decoders or memory bank decoder elements assigned to a memory bank can be disposed on the memory chip in direct spatial proximity to the respective memory bank. As shown in FIG. 1, the groups 1, 2, 3, 4 of memory banks are disposed at the respective corners of the rectangular semiconductor chip 7. The memory bank decoders 31, 42 are disposed in proximity to inner ends of the memory banks 11, . . . , 14, 21, . . . , 24. In an advantageous manner, the layout of the memory banks of group 1 with regard to the layout of the memory banks of group 2 is additionally configured also to be mirror-symmetrical with respect to the axis 6.

From the enable signal EN and the address signals ADR0, ADR1, ADR2, the predecoder 5 generates the output signals EN1, ADR11, ADR01 for the memory bank decoder 31 and the output signals EN2, ADR12, ADR02 for the memory bank decoder 42. On the side appertaining to the memory bank decoder 31, the predecoder 5 has AND gates 51, 52, 53, which each generate one of the address signals EN1, ADR11 and ADR01, respectively. One of the input signals EN, ADR1 and ADR0 is respectively fed in at one input of the AND gates 51, 52, 53. The other input of the AND gates 51, 52, 53 is wired up to the address signal ADR2 which is inverted via an inverter 54. On the side appertaining to the memory bank decoder 42, corresponding AND gates 55, 56, 57 are provided, which generate the output signals EN2, ADR12, ADR02. The AND gates are wired up differently from the AND gates 51, 52, 53 insofar as the address signals, ADR0, ADR1 on the one hand and ADR2 on the other hand, are fed inverted to the gates 55, 56, 57. Therefore, the address signal ADR2 is fed noninverted to the gates 55, 56, 57, while the address signals ADR0, ADR1 are fed inverted.

The above-described embodiment of the memory bank decoding results in a continuous address space of the memory cells in the memory banks. Therefore, for example, that the address range of the memory cells of the memory bank 11 directly adjoins the address range of the memory cells of the memory bank 12. In addition, the address range of the memory cells of the memory bank 21 directly adjoins the address range of the memory cells of the memory bank 14, without other intervening addresses. The respective addresses of the memory cells are in this case formed by the address bits ADR2, ADR1, ADR0 as most significant bits and correspondingly less significant bits, thereby enabling each of the memory cells of the memory banks to be uniquely addressed. The less significant address bits are the same for the memory cells of the all the memory banks 11, . . . , 14, 21, . . . 24.

Figure 3:
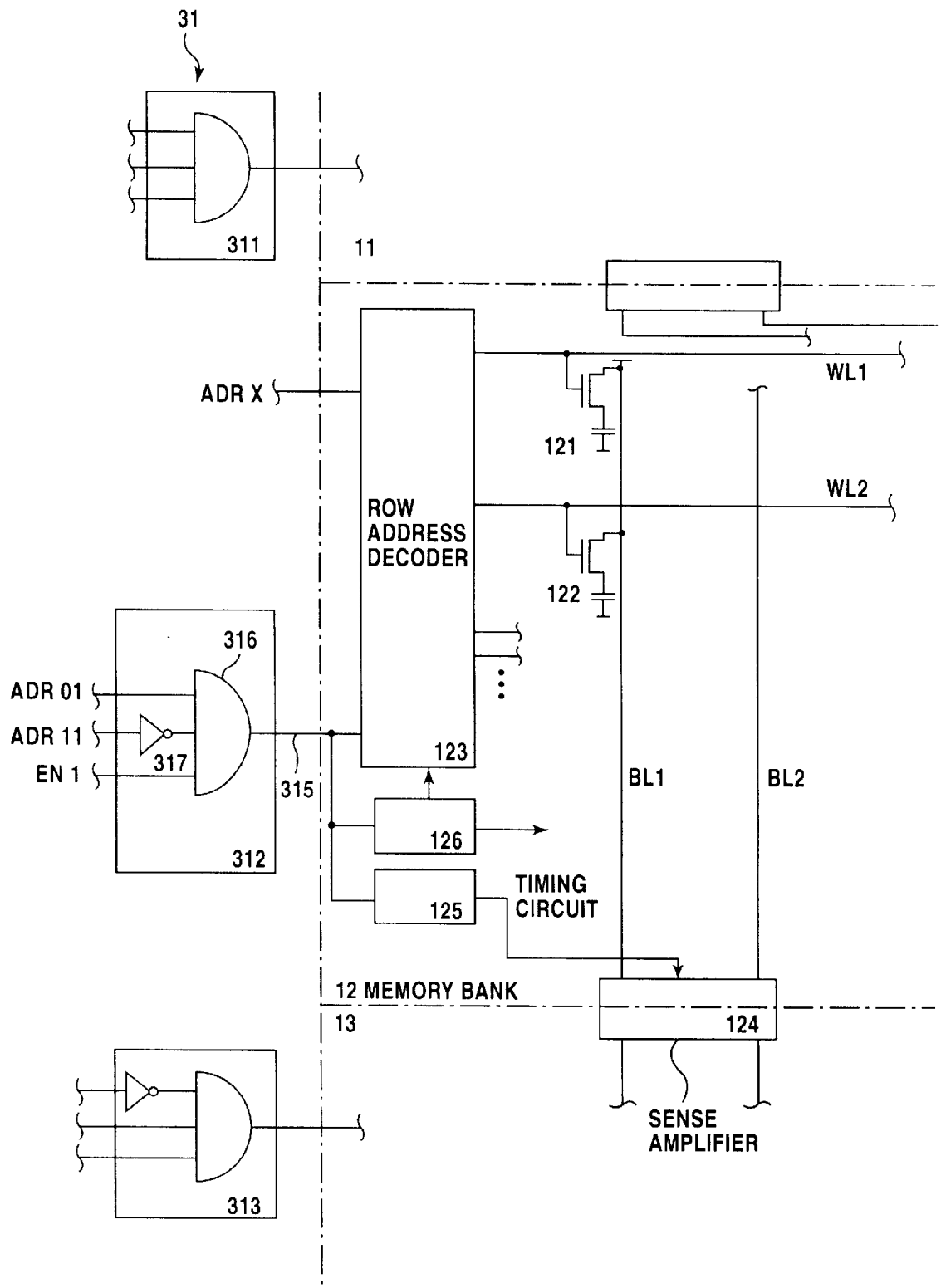
FIG. 3 is a block diagram of a detail of the memory bank.

The detail illustrated in FIG. 3 shows the surroundings of the memory bank 12. The memory bank 12 contains a multiplicity of memory cells disposed in a matrix-like manner, of which memory cells 121, 122 are illustrated. Each memory cell contains a storage capacitor and an access transistor. A memory cell is accessed by the access transistor being turned on. A respective word line WL1 and WL2 is used for this purpose. The word lines WL1, WL2 are disposed in rows and are activated and deactivated by a row address decoder 123. In a column-by-column manner, the memory cells are connected to a bit line BL1 via the conduction path of the respective access transistor. Neighboring bit lines BL1, BL2 are connected to a sense amplifier 124, which serves to amplify the information read from a memory cell. One of the memory cells is selected by the respective word line to which the memory cell is connected and the respective sense amplifier being activated. Memory cells assigned to a column are in each case connected to a bit line; memory cells assigned to a row are in each case connected to a word line. It is expedient for directly adjacent memory banks, e.g. memory banks 12 and 13, to use the sense amplifiers, e.g. 124, together. A memory bank is characterized in that only one word line and therefore only one memory cell or one memory word can be addressed simultaneously.

The memory bank 12 is activated by an output 315 of the decoder element 312 of the memory bank decoder 31. Therefore, the functional units of the memory bank 12 can be activated and deactivated by the output 315 of the decoder element 312. For this purpose, the output 315 is fed to the row address decoder 123. Furthermore, the output 315 drives a timing circuit 125, which activates and deactivates the sense amplifier 124 in dependence on the row addressing, and also a redundancy decoder 126, which replaces defective memory cells of the memory bank 12 with redundancy cells. The subdecoder element 312 of the memory bank decoder 31 is implemented in such a way that the output 315 is activated only when there is a specific combination of input signals EN1, ADR11, ADR01. The subdecoder element 312 is activated with the combination EN1=1, ADR11=0, ADR01=1. For this purpose, the subdecoder element 312 has an AND gate 316 and also an inverter 317, by which the address signal ADR11 is fed inverted to the AND gate 316. Other remaining address signals ADRX, which are used neither for the memory bank decoding (like ADR0, . . . , ADR2) nor for the column address decoding, are applied to the address inputs of the row decoder 123. The address signals ADRX are also fed to the row decoders of the other memory banks, the row decoders corresponding to the row decoder 123. The group 1 of memory banks contains four ($2^2$) memory banks 11, . . . , 14. The memory bank decoder 31 therefore contains 4 ($2^2$) subdecoder elements 311, . . . , 314. The address signals ADR11, ADR01 or the address signals ADR0, ADR1, which are fed to the predecoder 5, serve for selection between the subdecoder elements. There are a total of 2 ($2^1$) memory bank decoders 31, 42 on the chip. A changeover is made between the address decoders 31, 42 by the address signal ADR2 fed to the predecoder 5. Each of the decoder elements 311, . . . , 314 is implemented in such a way that its output signal is activated only for a single one of the possible combinations of its input address signals ADR11, ADR01.

I claim:

1. A semiconductor memory, comprising:

a number of memory banks, each including:
   a memory cell array having a multiplicity of memory cells disposed in a matrix-like manner having rows and columns and defining a matrix of memory cells; and
   an address decoder for selecting one of a row and a column of said matrix of memory cells;

means for feeding in an address containing a number of address bits for selecting one of said row and said column of one of said memory cells by addressing said address decoder;

memory bank decoders, including:
   a first memory bank decoder connected to a first group of said memory banks, said first memory bank decoder having an input side, an output side and generating a first respective bank selection signal available at said output side for each memory bank of said first group of said memory banks, resulting in one of said memory banks of said first group of memory banks being selected by an activation of the first respective bank selection signal; and
   a second memory bank decoder connected to a second group of said memory banks and having an axially mirror-symmetrical layout with respect to said first memory bank decoder, said second memory bank decoder having an input side, an output side and generating a second respective bank selection signal available at said output side for each memory bank of said second group of said memory banks, resulting in that one of said memory banks of said second group of said memory banks being selected by an activation of the second respective bank selection signal; and a predecoder having a logic circuit, an input side and an output side, said predecoder generating on said output side first address signals and second address signals complementary to the first address signals, the first address signals and the second address signals being fed to said first memory bank decoder and said second memory bank decoder, respectively, and said input side of said predecoder receiving a portion of the address bits.

2. The semiconductor memory according to claim 1, wherein said first memory bank decoder and said second memory bank decoder are axially symmetrical with respect to an axis of symmetry lying between said first memory bank decoder and said second memory bank decoder.

3. The semiconductor memory according to claim 1, wherein said predecoder contains first logic circuit elements each having an input side and an output side and generating the first address signals for said first memory bank decoder on said output side, and second logic circuit elements each having an input side and an output side and generating the second address signals for said second memory bank decoder on said output side, and in that respective complementary address bits can be fed to said first logic circuit elements and second logic circuit elements on said input side.

4. The semiconductor memory according to claim 3, wherein a first portion of the address bits can be fed non-inverted to said first logic circuit elements and inverted to said second logic circuit elements, and a second portion of the address bits can be fed inverted to said first logic circuit elements and non-inverted to said second logic circuit elements.

5. The semiconductor memory according to claim 1, wherein said predecoder generates a first enable signal and a second enable signal that are fed to said first memory bank decoder and to said second memory bank decoder, respectively, and the first enable signal and the second enable signal do not have simultaneously active pulses.

6. The semiconductor memory according to claim 1, wherein another portion of the address bits can be fed to said address decoder of said memory banks resulting in that addresses of said memory cells of directly adjacent memory banks directly succeed one another.

7. The semiconductor memory according to claim 4, wherein said number of said memory banks is $2^m$ different memory banks, the first portion of the address bits has n different address bits, the second portion of the address bits has k different address bits, and there are $2^k$ of said memory bank decoders each having $2^n$ memory bank decoder elements in that an output signal of one of said memory bank decoder elements of one of said memory bank decoders is activated when a specific one of $2^n$ possible combinations of states of the address bits fed to a respective memory bank decoder is present, and in that each of said memory bank decoder elements of a memory bank decoder can be activated with a different combination.

8. The semiconductor memory according to claim 1, wherein said memory banks have edge ends and said first memory blank decoder and said second memory bank decoder lie next to said edge ends of said memory banks.

* * * * *